US012597887B2

(12) United States Patent
Venkiteswaran et al.

(10) Patent No.: US 12,597,887 B2
(45) Date of Patent: Apr. 7, 2026

(54) METHODS AND APPARATUS TO IMPROVE PERFORMANCE SPECIFICATIONS OF AMPLIFIERS

(71) Applicant: TEXAS INSTRUMENTS INCORPORATED, Dallas, TX (US)

(72) Inventors: Mahadevan Shankara Venkiteswaran, Bangalore (IN); Arun Singh, Bangalore (IN); Nimidev Kovilparambil Prasannan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 721 days.

(21) Appl. No.: 17/732,383

(22) Filed: Apr. 28, 2022

(65) Prior Publication Data

US 2023/0353096 A1 Nov. 2, 2023

(51) Int. Cl.
| | |
|---|---|
| *H03F 1/02* | (2006.01) |
| *H03F 3/21* | (2006.01) |
| *H03F 3/45* | (2006.01) |

(52) U.S. Cl.
CPC ........... *H03F 1/0227* (2013.01); *H03F 3/211* (2013.01); *H03F 3/45071* (2013.01)

(58) Field of Classification Search
CPC ...... H03F 1/0227; H03F 1/342; H03F 1/0205; H03F 1/301; H03F 3/211; H03F 3/45071; H03F 3/45183; H03F 3/45475; H03F 2203/45318; H03G 1/0029; H03K 5/2481
See application file for complete search history.

(56) References Cited

U.S. PATENT DOCUMENTS

| | | | |
|---|---|---|---|
| 7,777,574 B1 | 8/2010 | Nielsen | |
| 7,994,858 B2 | 8/2011 | Standley et al. | |
| 2020/0119698 A1* | 4/2020 | Purdila | ............... H03F 3/45766 |
| 2023/0353096 A1 | 11/2023 | Venkiteswaran et al. | |

FOREIGN PATENT DOCUMENTS

| | | |
|---|---|---|
| CN | 116979910 A | 10/2023 |

OTHER PUBLICATIONS

Machine translation for CN116979910A.

* cited by examiner

*Primary Examiner* — Andrea Lindgren Baltzell
*Assistant Examiner* — Nareh Shamiryan
(74) *Attorney, Agent, or Firm* — Xianghui Huang; Frank D. Cimino

(57) ABSTRACT

An example apparatus includes a first amplifier stage having a first stage input, a first input pair having a first input and a first output coupled to the first stage input, a second input pair having a second input and a second output, current steering circuitry having a third input, a fourth input, a third output, and a fourth output, the third output coupled to the first input and the fourth output coupled to the second input, source follower circuitry having a fifth input and a fifth output, the fifth output coupled to the first input, and a comparator having a sixth output coupled to the fifth input.

20 Claims, 3 Drawing Sheets

METHODS AND APPARATUS TO IMPROVE PERFORMANCE SPECIFICATIONS OF AMPLIFIERS

TECHNICAL FIELD

This description relates generally to amplifiers, and more particularly to methods and apparatus to improve performance specifications of amplifiers.

BACKGROUND

High precision amplifiers may be designed similar to an operational amplifier but with a higher performance specification. The gain of high precision amplifiers is required to remain consistent even when under zero load current conditions. High precision amplifiers include a minimum gain requirement resulting in frequency stability with capacitive loads and low distortion of sinusoidal signals. High voltage supply (e.g., voltage supply VDD) may result in variations in the performance of high precision output stage.

Negative Bias Temperature Instability (NBTI) and Positive Bias Temperature Instability (PBTI) are phenomena observed in some metal-oxide-semiconductor field effect transistors (MOSFETs) that causes performance instability in the affected MOSFETs. NBTI and PBTI may occur due to aging of the affected devices, elevated device temperature and/or the gate biasing of the affected devices. P-channel metal-oxide semiconductor (PMOS) transistors are more susceptible to NBTI than N-channel metal-oxide semiconductor (NMOS) transistors. NBTI results in the threshold voltage, required to turn "on" (e.g., cause to conduct current) a transistor, to vary as an interface charge builds on a subsurface of a gate of a transistor over time. The NBTI and PBTI effects on high precision amplifiers may result in increasing variation in the operation of the amplifier.

SUMMARY

For methods and apparatus to improve performance specifications of amplifiers, an example apparatus includes a first amplifier stage having a first stage input. The example apparatus includes a first input pair having a first input and a first output coupled to the first stage input. The example apparatus includes a second input pair having a second input and a second output. The example apparatus includes current steering circuitry having a third input, a fourth input, a third output, and a fourth output, the third output coupled to the first input and the fourth output coupled to the second input. The example apparatus includes source follower circuitry having a fifth input and a fifth output, the fifth output coupled to the first input. The example apparatus includes a comparator having a sixth output coupled to the fifth input.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
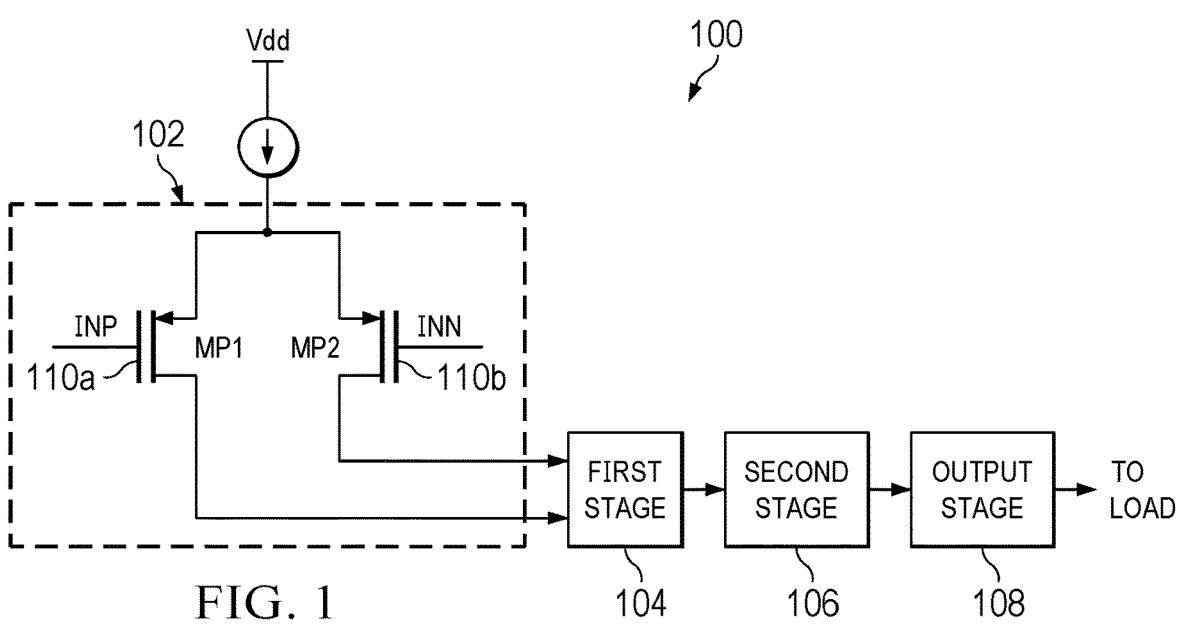
FIG. 1 is a schematic diagram of example amplifier circuitry and an example main input pair that experiences negative effects of bias temperature instability during unregulated conditions.

In high precision amplifiers, there may be an issue with ensuring precision and performance over an extended period of time (e.g., the lifetime of an amplifier). For example, it can be difficult to maintain the precision of an amplifier and ensure robust performance over the entire life of the amplifier. In large part, this can be due to degradation of MOSFET devices from the NBTI and/or PBTI phenomena. In some examples, "precision" includes an offset accuracy specification. The offset accuracy specification defines how the amplifier resolves a given signal output error. Ideally, the output of a differential amplifier should be at zero volts when both inputs are exactly at the same potential. However, in reality, the output goes to zero volts when there is a small voltage difference between the inputs. This non-ideality originates from the inherent mismatch between the components inside the amplifier. The voltage that must be applied between the input terminals of the amplifier to bring its output voltage to zero volts is called the input offset voltage. In some examples, it is ideal to minimize the input offset voltage because inherent mismatches can degrade the precision of the amplifier circuitry over time.

In some examples, amplifiers are designed to compensate and/or correct inherent mismatches in the amplifier circuitry to minimize the output error. For example, amplifiers are calibrated using a trimming method for correcting any inherent mismatches as part of a foreground routine at final test or probe for most amplifier products. For example, an amplifier is manufactured and goes through the final testing phase before production. During testing, the amplifier has, for example, a 100 µV offset instead of an ideal 0 V offset. To correct for this inherent mismatch, the 100 µV are trimmed out at time zero (e.g., at the time before the amplifier is in use) and the amplifier is recalibrated.

Although this recalibration method improves the precision of the amplifier, it only improves the precision at time zero. Therefore, during the lifetime of the amplifier, the precision degrades again, due to different effects, such as NBTI and/or PBTI. For example, key amplifier circuitry components for matching may be subject to differential stress over various unregulated conditions, such as open loop comparator mode, shutdown operation with inputs skewed, short circuit condition at the output, overload condition, etc. The components that are supposed to match, under these conditions, become effected by NBTI and/or PBTI. A key component in the amplifier circuitry is the input differential pair. The input pair should be matched (e.g., the input pair of transistors should be as close to identical, in structure and performance, as possible) in order for the output error to be minimal. However, during the lifetime of the amplifier, the input differential pair is impacted by NBTI and/or PBTI and there becomes mismatch at the component.

In addition to other external factors (e.g., ambient temperature), the NBTI shift arises from "negative" gate-to-source voltage stress, and the PBTI shift arises from a positive gate-to-body voltage stress. Depending on the biasing of the transistors, either of these effects could arise during the unregulated conditions. The unregulated conditions may exacerbate NBTI and PBTI degradation in the presence of extreme temperatures. For example, the greater the temperature during an unregulated condition, the worse the effect on the amplifier. The NBTI and/or PBTI effects may modulate (e.g., cause to deviate from an ideal or an expected value) a threshold voltage for the MOS devices.

An important factor in terms of matching is that the threshold voltage of the input devices track together. The threshold voltage of a MOS device is the voltage at the gate required to fully invert the semiconductor. For example, an N-Channel MOSFET device is comprised of a P-type semiconductor, doped with two separated N-type regions, coupled to a metal oxide gate. The P-type semiconductor is the bulk and/or body of the MOSFET device and includes a number of "holes" (e.g., absences of electrons). When a positive voltage is applied to the metal oxide gate relative to the semiconductor (e.g., the body, the bulk, etc.), a depletion region forms around the N-type regions, blocking any electrons in one of the N-type regions from moving to the other N-type region. As the voltage at the gate continues to become more positive relative to the semiconductor, and when there is a voltage applied across the two N-type regions (creating an electric field), a channel of electrons forms in the P-type semiconductor between the two N-type regions. The gate voltage at which the channel of electrons begins to form (e.g., when the semiconductor becomes inverted) is the threshold voltage.

Ideally, as just mentioned, the gate voltage is applied with respect to the voltage of the semiconductor (e.g., the body, the bulk, etc.). PBTI arises when there is a high voltage stress applied at the gate with respect to the semiconductor, otherwise referred to as gate-to-body voltage stress and/or gate-to-bulk voltage stress. In some examples, this high voltage stress between the gate and semiconductor causes electrons to get trapped in the metal oxide gate and, thus, causes the threshold voltage to increase. For example, a higher gate voltage will be required to invert the semiconductor when the electrons are trapped in the metal oxide and not free to form the channel between the two doped regions of the semiconductor.

When NBTI and/or PBTI modulates the threshold voltage of one input device (e.g., a first MOSFET), the threshold voltage of the other input device (e.g., a second MOSFET) may no longer match the threshold voltage of the one input device. Threshold voltage mismatch in the input devices directly manifests in the form of an offset. That may start to degrade the performance of the amplifier (or other analog circuit that relies on a matching input pair of transistors). In prior solutions, a method and/or implementation that tracks NBTI and/or PBTI effects over the lifetime of the amplifier does not exist and, thus, a method and/or implementation that corrects and/or reduces degradation of the amplifier over its lifetime has not been readily available.

For example, one solution and/or method to correct and/or reduce degradation of an amplifier due to temperature instability includes tying the semiconductor (e.g., the body, the bulk, etc.) a supply voltage of the amplifier. This solution is used to ensure that the potential of the semiconductor does not change and/or does not fall below a potential at the gate of the input pair of transistors. However, this solution includes drawbacks and additionally does not improve the lifetime performance of the amplifier, as described in further detail below in connection with FIG. 1.

In addition to the device issues discussed above, there may be secondary sources of differential stress in an amplifier (e.g., different sources than the input devices). For example, in a folded cascoded amplifier (e.g., a type of high precision amplifier), a fold (e.g., current mirrors at the output signal chain of the amplifier) contributes to differential stress of the amplifier. Ideally, when the amplifier is operating, the gate to source voltages of transistors of the current mirror are equal or approximately equal. However, when there is mismatch at the input devices, a mismatch results between the current mirror transistors which negatively effects the precision of the amplifier.

Another example of a secondary source of differential stress is when a high precision amplifier is to be utilized as a comparator. An amplifier utilized as a comparator has a differential input voltage. As such, the differential input voltage causes the input devices to degrade.

Examples disclosed herein reduce and/or eliminate degradation of an amplifier during its lifetime by implementing circuitry that removes supply voltage to a pair of input transistors when there is "negative" gate-to-source voltage stress (e.g., NBTI) and circuitry that removes supply voltage to the pair of input transistors when there is a positive gate-to-bulk voltage stress (e.g., PBTI). In examples disclosed herein, a sacrificial and/or auxiliary input device is activated in response to the differential voltage on the main input device. In examples disclosed herein, the circuitry corrects the differential voltage on the main input device while the activated auxiliary input device serves as the input to the amplifier. As such, the main input device does not degrade and/or minimally degrades from the differential voltage.

Examples disclosed herein utilize differential voltage sensing to activate a comparator to mitigate NBTI stress. The comparator disclosed herein is configured to cut off the supply voltage to the main input pair (e.g., main input device) by bringing the potential at the source node below the gate voltage. As such, the example circuitry prevents any biasing of the transistors of the main input pair. Examples disclosed herein utilize a max selector circuit to mitigate PBTI stress. The max selector circuit disclosed herein is configured to tie the bodies (e.g., the semiconductors, the bulk portions of the MOSFET, etc.) of the main input pair to a voltage that is greater than the maximum of both input voltages to prevent gate-to-bulk voltage from being greater than zero volts. For example, PBTI occurs when the gate voltage is greater than the bulk voltage of either of the transistors in the main input pair. Therefore, the example circuitry ties the bulk voltage of the transistor to a point that will always be higher than the input voltage.

FIG. 1 is a schematic diagram of example amplifier circuitry 100 coupled to example input circuitry 102 that experiences negative effects of PBTI and NBTI during an unregulated condition. The amplifier circuitry 100 includes example first stage circuitry 104, an example second stage circuitry 106, and an example output stage 108.

In FIG. 1, the input circuitry 102 includes an example main input pair (comprised of transistors 110a and 110b, which are collectively and/or individually referred to by reference number 110). The first transistor 110a and the second transistor 110b are driven by a first input (INP) and a second input (INN). The first transistor 110a and the second transistor 110b include a first output and a second output. The potential applied to first input (INP) and the second input (INN) may be equal or approximately equal), or inputs INP and INN may receive different potentials (such as in examples where inputs INP and INN form a differential input to amplifier 100). For example, the first input (INP1) may receive 5 volts and the amplifier circuitry 100 is to regulate the second input (INN1) to 5 volts through negative feedback. In this example, the first transistor 110a and the second transistor 110b are P-channel MOSFETs (pMOS- FETs). Alternatively, the first transistor 110a and the second transistor 110b may be P-channel field-effect transistors (FETs), P-channel insulated-gate bipolar transistors (IG-BTs), P-channel junction field effect transistors (JFETs), or PNP bipolar junction transistor (BJTs).

Figure 2:
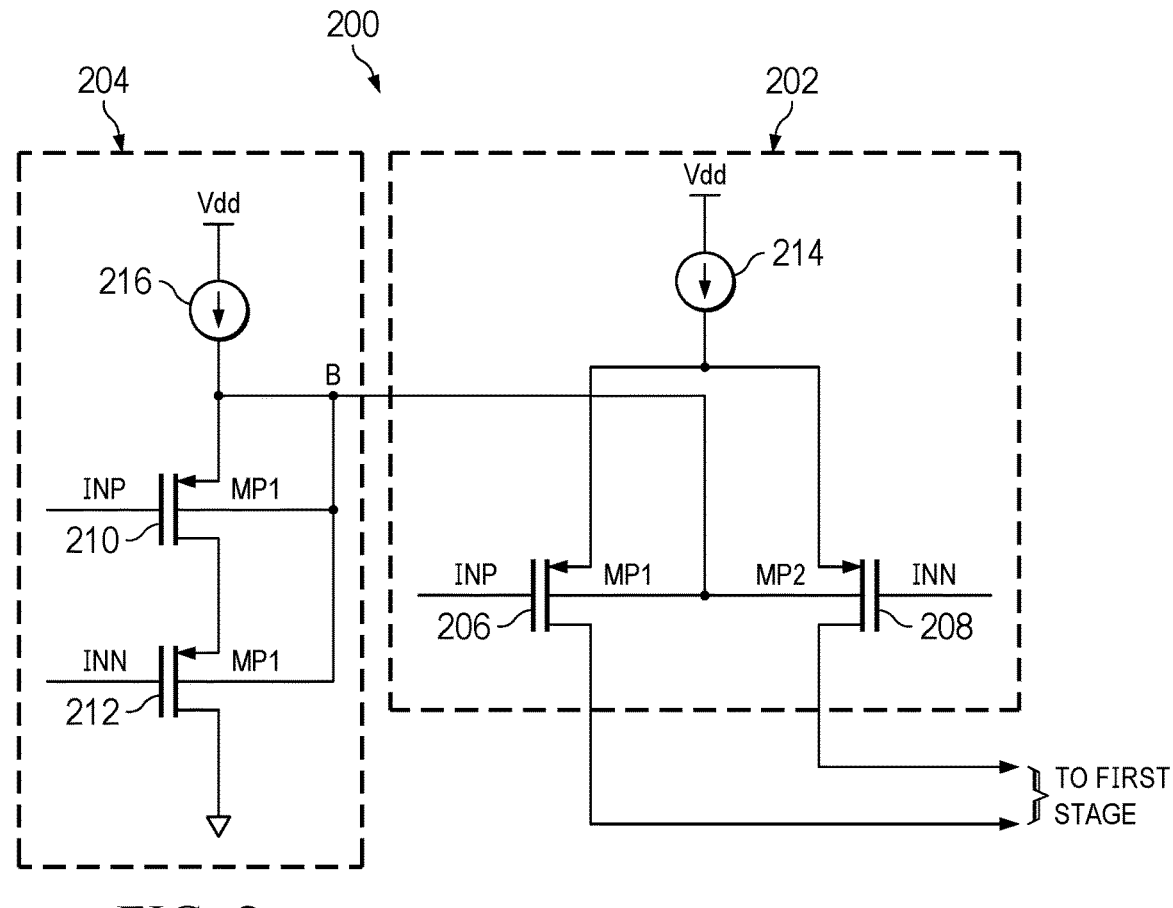
FIG. 2 is a schematic diagram of example first input circuitry to facilitate protecting the example main input pair of FIG. 1 from degradation due to PBTI during unregulated conditions.
Figure 3:
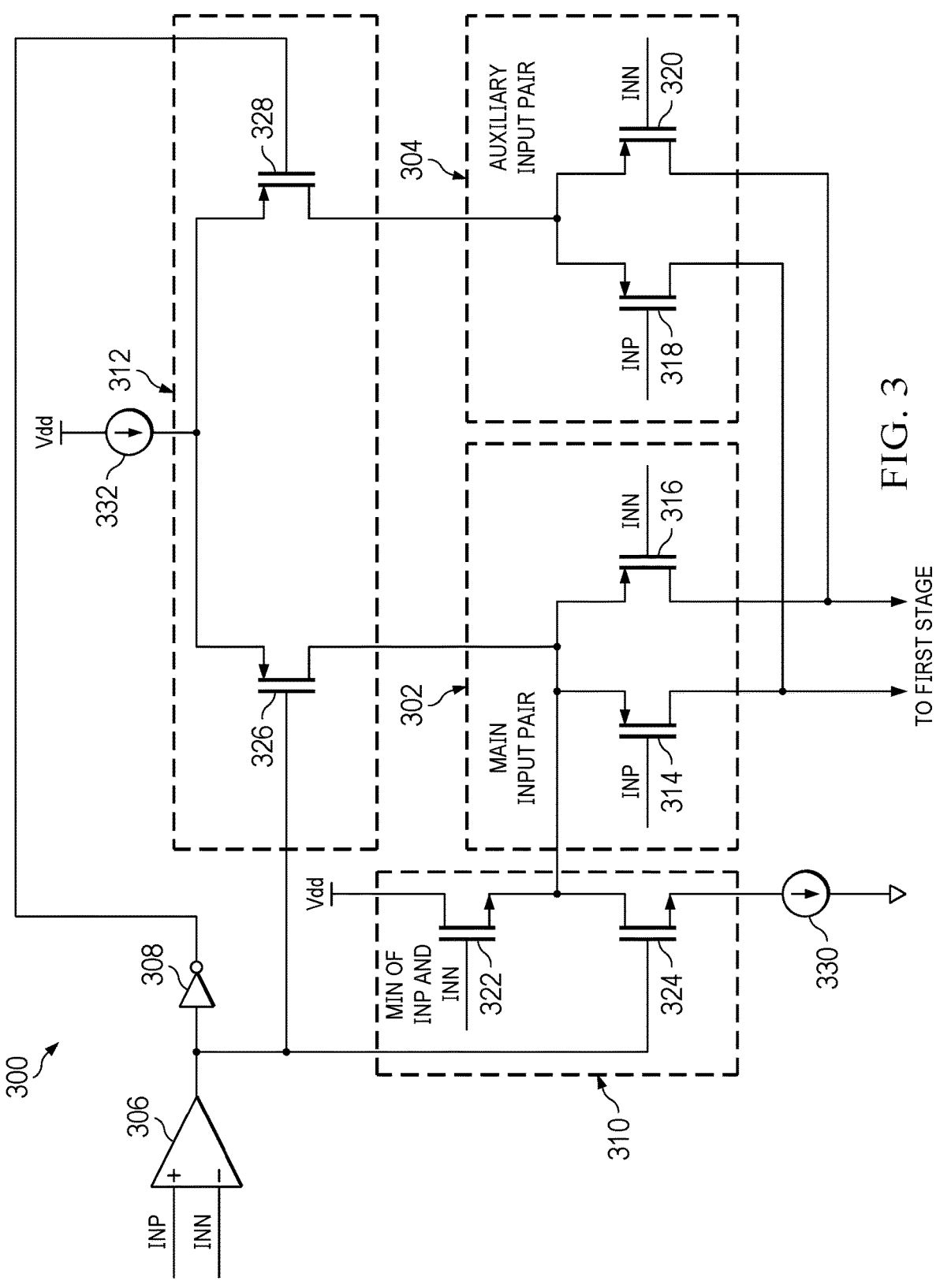
FIG. 3 is a schematic diagram of example second input circuitry to facilitate protecting the example main input pair of FIG. 1 from degradation due to NBTI during unregulated conditions.

In some examples, the main input pair 110 is subject to differential stress. For example, during an unregulated condition, the first input (INP) includes a different voltage than the second input (INN). The voltage difference between the two inputs (INP, INN) directly manifests in the form of an offset. Such an offset will start to degrade the performance of the first transistor 110a and the second transistor 110b. FIGS. 2 and 3 include circuitry that eliminates and/or reduces degradation of the first transistor 110a and second transistor 110b, as described in further detail below.

In FIG. 1, the amplifier circuitry 100 includes the first stage circuitry 104 to amplify the input signals (INP, INN). These amplified signals are applied to an input of the second stage circuitry 106. The first stage circuitry 104 includes inputs that are coupled to the drain terminals of the first transistor 110a and second transistor 110b. The first stage circuitry 104 includes an output that is coupled to the second stage circuitry 106. The first stage circuitry 104 includes a plurality of transistors (not shown) to perform the first stage amplification of the input signals. In some examples, the first stage circuitry 104 is folded cascode circuitry. The folded cascode circuitry has a large output swing and has higher gain compared to ordinary op-amp circuitry. In some examples, folded cascode circuitry is suitable for deep negative feedback because of its small signal gain that can be very large.

In FIG. 1, the amplifier circuitry 100 includes the second stage circuitry 106 to adjust and/or further amplify signals output by the first stage circuitry 104. The second stage circuitry 106 includes inputs that are coupled to the first stage circuitry 104 output and includes outputs that are coupled to the output stage 108. The second stage circuitry 106 includes a plurality of transistors (not shown) to achieve amplification and/or improvement of the signals output by the first stage circuitry 104. For example, the first stage circuitry 104 may be used as the voltage gain stage to amplify the input voltage if the input voltage is not of a desired level (e.g., if the desired level of voltage is 5 volts but the supply voltage can only output a maximum of 1 volt, the first stage circuitry amplifies the source voltage to the desired 5 volts). The second stage circuitry 106 can be utilized to convert the amplified voltage into current and achieve the desired amplification of the signals output by the first stage circuitry 104. In some examples, the second stage circuitry 106 improves the signals output by the first stage circuitry by providing impedance matching between the first stage circuitry 104 and the output stage 108. For example, impedance mismatch between a first stage of an amplifier and an output stage of the amplifier can lead to signal reflection and inefficient power transfer. Impedance matching is therefore important to ensure power transfer efficiency between the amplified signals output by the first stage circuitry 104 and the output. Additionally and/or alternatively, the second stage circuitry 106 may be any type of circuitry utilized in amplifiers to affect input signals in some way. In some examples, the amplifier circuitry 100 does not include the second stage circuitry 106. For example, the second stage circuitry 106 can be optional circuitry.

The amplifier circuitry 100 includes the example output stage 108 to output a signal, having a certain amount of power, voltage and/or current to a load. In this example, the output stage 108 includes a plurality of transistors and devices (not shown).

In an example first operation of the amplifier circuitry 100, the voltage at the first input INP is equal to or approximately equal to the voltage at the second input INN. The input circuitry 102 injects a current into the fold (e.g., the inputs of the first stage circuitry 104) of the first stage circuitry 104. The current is converted into voltage by the first stage circuitry 104 and further amplified by the second stage circuitry 106. The output stage 108 delivers the current to the load. In the example first operation, the amplifier circuitry 100 is operating without degradation issues.

However, in a different example operation where the voltage at the first input (INP) is different (e.g., may be greater than or less than) than the voltage at the second input (INN), the input circuitry 102 may be degraded (e.g., degraded due to NBTI and/or PBTI). Some solutions to avoid bias temperature instability, as mentioned above, include tying the bulk terminals of the input pair of transistors to a supply voltage (AVDD). However, this solution includes drawbacks.

An example drawback to the solution of tying the bulk voltage to the supply voltage includes a threshold voltage that regularly varies with the input voltage. For example, the common mode rejection ratio (CMRR) may degrade because the voltage at the bulk (e.g., the semiconductor) will not track the common mode input voltage (e.g., the range of input voltage in which the op-amp functions properly when the same signal is applied to the INP and INN terminals) when the bulk is tied to the supply voltage. Therefore, the threshold voltage of the affected transistors modulates. As described above, the threshold voltage of a transistor is the minimum gate voltage that is needed to create a conducting path between the source and drain terminals (e.g., N-type doped regions and/or P-type doped regions) of the transistor. In some examples, the threshold voltage is an important scaling factor to maintain power efficiency of the main input pair. In some examples, CMRR degradation manifests itself when the offset changes with input voltage variation. The offset changes with input voltage variation in response to offset differences with varying threshold voltages, and threshold voltages may vary when the bulk is tied to the supply voltage.

Another example drawback to the solution of tying the bulk voltage directly to the supply voltage is that the input voltage common mode range could be affected. For example, the threshold voltage goes high when the bulk terminal is biased higher than the source terminal and, thus, affects the input voltage common mode range. FIG. 2 illustrates example circuitry that protects the amplifier circuitry 100 from degradation due to PBTI.

FIG. 2 is a schematic diagram of an example first input circuitry 200 to facilitate protecting an example main input pair 202 from degradation during an unregulated condition. In this example, the first input circuitry 200 reduces and/or eliminates the negative effects of PBTI on the main input pair 202. The example first input circuitry 200 includes the example main input pair 202 and example max selector logic 204.

In FIG. 2, the main input pair 202 includes an example first transistor 206 and an example second transistor 208. In some examples, the main input pair 202 may be implemented by the input circuitry 102 of FIG. 1. The first transistor 206 includes a drain (e.g., current terminal, drain terminal, a collector terminal, etc.), a source (e.g., current terminal, source terminal, an emitter terminal, etc.), a gate (e.g., base terminal, base, etc.), and a bulk terminal (e.g., a body terminal, semiconductor, etc.). The second transistor 208 includes a drain, a source, a gate, and a bulk terminal. In this example, the source terminals of the first and second transistors 206, 208 are coupled to a first current source 214 and the bulk terminals of the first and second transistors 206, 208 are coupled to each other (e.g., the bulk terminal of the first transistor 206 is coupled to the bulk terminal of the second transistor 208). The drain terminals of the first and second transistors 206, 208 are coupled to folded cascode circuitry (not shown) and/or to any first stage of amplifier circuitry. The gate terminal of the first transistor 206 is configured to receive the first input signal (INP) and the gate terminal of the second transistor 208 is configured to receive the second input signal (INN).

The first transistor 206 and the second transistor 208 are P-channel MOSFETs (pMOSFETs). Alternatively, the first transistor 206 and/or the second transistor 208 may be P-channel field-effect transistors (FETs), P-channel insulated-gate bipolar transistors (IGBTs), P-channel junction field effect transistors (JFETs), or PNP bipolar junction transistor (BJTs). The first transistor 206 and the second transistor 208 may be of equal size (e.g., gate width and/or length, channel width and/or length, etc.) and are to receive equal or approximately equal signals.

In FIG. 2, the max selector logic 204 includes an example third transistor 210 and an example fourth transistor 212. The third transistor 210 includes a drain, a source, a gate, and a bulk terminal. The drain of the third transistor 210 is coupled to the source of the fourth transistor 212. The source of the third transistor 210 is coupled to a second current source 216. The gate of the third transistor 210 is configured to receive the first input signal (INP) and the gate of the fourth transistor 212 is configured to receive the second input signal (INN). The bulk terminals of the third transistor 210 and the fourth transistor 212 are tied to (e.g., coupled to) the source of the third transistor 210 at the bias node (B) and to the bulk terminals of the first and second transistors 206, 208 at a bias node (B).

In some examples, an unregulated condition may occur at the main input pair 202 and there is a differential voltage between the first and second transistors 206, 208. In such an example (e.g., where the bulk terminals are not connected as shown in FIG. 2), the bulk voltage at the bulk terminal of the first transistor 206 may be less than the gate voltage at the gate of the first transistor 206 and/or less than the source voltage (e.g., the supply voltage) at the source of the first transistor 206. For example, the first transistor 206 may receive a gate voltage of five volts and the second transistor 208 receives a gate voltage of zero volts. In such an example, the bulk voltage is lower than the gate voltage. When the bulk voltage is lower than the gate voltage, PBTI may occur (e.g., under certain circumstances, such as during periods of higher ambient temperatures) and causes the degradation of precision and/or performance of the complimentary transistors.

In this example, to avoid the PBTI effect, the bulk terminals of the first and second transistors 206, 208 are biased to the voltage at bias node B. The voltage at the bias node B is determined based on which input voltage (INP, INN) is higher. For example, if INP is five volts greater than INN, the third transistor 210 may be off and/or conducting minimum current relative to the fourth transistor 212 responsive to the higher INP input voltage. Therefore, the voltage at the bias node B may be the gate to source voltage ($V_{GS}$) plus the voltage of INP. For example, the potential of the bulk terminal of the third transistor 210 follows the potential of the gate of the third transistor 210. The bulk terminal of the third transistor 210 is coupled to the bias node B and determines the potential at the bias node B responsive to INP having a greater voltage than INN. In this manner, the bulk terminals of the first transistor 206 and the second transistor 208 are biased to a greater voltage than the highest input voltage. As such, stress from PBTI due to positive gate-to-bulk voltage does not occur. In some examples, the voltage at node B stabilizes at approximately the value of the supply voltage, if the bulk voltage is approximately equal to the supply voltage.

In some examples, INN is greater than INP. For example, INN may be five volts greater than INP. The third transistor 210, in this example, enters into linear mode (e.g., conducts current linearly as INP decreases and/or increases) responsive to the lower voltage on INP. The fourth transistor 212 turns off (e.g., does not conduct current) and/or conducts minimum current relative to the third transistor 210. The voltage at the bias node B is one threshold voltage greater than the voltage of INN responsive to the high input voltage (INN) at the gate of the fourth transistor 212. For example, the potential of the bulk terminal of the fourth transistor 212 follows the potential at the gate of the fourth transistor 212 because the bulk terminal is shorted to the source terminal, and the voltage potential at the source terminal follows the gate voltage. The bulk terminal of the fourth transistor 212 is coupled to the bias node B and determines the potential at bias node B responsive to INN having a greater voltage than INP. For example, the the the gate-to-source voltage (e.g., the threshold voltage plus overdrive, where overdrive is an additional voltage used to set the desired current through the transistor) of the fourth transistor 212 sets the potential at bias node B. In this manner, the bulk terminals of the first transistor 206 and the second transistor 208 are biased to a greater voltage than the highest input voltage (e.g., greater than the voltage of INN). As such, no PBTI occurs.

FIG. 3 is a schematic diagram of an example second input circuitry 300 to facilitate protecting an example main input pair 302 from degradation during an unregulated condition. In this example, the second input circuitry 300 reduces and/or eliminates the negative effects of NBTI on the main input pair 302. The example second input circuitry 300 includes the example main input pair 302, an example auxiliary input pair 304, an example window comparator 306, an example logic gate 308, example source follower circuitry 310, and example current steering circuitry 312.

In FIG. 3, the main input pair 302 includes an example first transistor 314 and an example second transistor 316. In some examples, the main input pair 302 may be implemented by the input circuitry 102 of FIG. 1 and/or the main input pair 202 of FIG. 2. The first transistor 314 includes a drain, a source, and a gate. The second transistor 316 includes a drain, a source, and a gate. The gate of the first transistor 314 is configured to receive the first input signal (INP) and the gate of the second transistor 316 is configured to receive the second input signal (INN). The source of the first transistor 314 is coupled to the source of the second transistor 316. The first transistor 314 and the second transistor 316 are P-channel MOSFETs (pMOSFETs). Alternatively, the first transistor 314 and the second transistor 316 may be P-channel field-effect transistors (FETs), P-channel insulated-gate bipolar transistors (IGBTs), P-channel junction field effect transistors (JFETs), or PNP bipolar junction transistor (BJTs). The first transistor 314 and the second transistor 316 are of equal size and are configured to obtain equal and/or approximately equal signals.

In FIG. 3, the auxiliary input pair 304 includes a third transistor 318 and a fourth transistor 320. The third transistor 318 includes a drain, a source. The fourth transistor 320 includes a drain, a source, and a gate. The gate of the third transistor 318 is configured to receive the first input signal (INP) and the gate of the fourth transistor 320 is configured to receive the second input signal (INN). The source of the third transistor 318 is coupled to the source of the fourth transistor 320. The third transistor 318 and the fourth transistor 320 are P-channel MOSFETs (pMOSFETs). Alternatively, the third transistor 318 and the fourth transistor 320 may be P-channel field-effect transistors (FETs), P-channel insulated-gate bipolar transistors (IGBTs), P-channel junction field effect transistors (JFETs), or PNP bipolar junction transistor (BJTs).

In FIG. 3, the second input circuitry 300 includes the window comparator 306 to compare the differential voltage between the first input (INP) and the second input (INN) to a an input differential threshold voltage. The input differential threshold voltage is indicative of an unregulated condition of the second input circuitry 300. For example, the input differential threshold voltage may be derived by determining the lowest amount of difference between the two inputs that would cause degradation of the main input pair 302. For example, the input differential threshold voltage may be an amount of voltage difference between INP and INN that begins to cause degradation of the first and second transistors 314, 316. In some examples, the input differential threshold voltage is derived by determining a differential voltage that ensures degradation of the first transistor 314 and/or the second transistor 316 (e.g., aging degradation of transistors 314, 316 due to NBTI and/or PBTI) is less than the threshold voltage of the comparator 306 to prevent the comparator 306 from outputting incorrect decisions (e.g., triggering at undesired and/or incorrect times). The window comparator 306 may be used to control the operation of the main input pair 302 and the auxiliary input pair 304. The non-inverting input of window comparator 306 is configured to receive the first input INP and the inverting input is configured to receive the second input INN. The window comparator 306 includes an output.

In FIG. 3, the logic gate 308 is implemented by an inverter. Additionally and/or alternatively, the logic gate 308 may be implemented by a logic AND gate, a logic OR gate, and/or any type of logic gate. In some examples, the logic gate 308 may be implemented by any combination of discrete transistors and/or other circuits elements that effect the function described herein based on analog signals. The logic gate 308 is coupled to the output of the window comparator 306. The logic gate 308 may be used to generate a signal that is complimentary to the signal generated by the window comparator 306.

In FIG. 3, the source follower circuitry 310 includes a fifth transistor 322, a sixth transistor 324, and a first current source 330. The fifth transistor 322 includes a drain, a source, and a gate. The sixth transistor 324 includes a drain, a source, and a gate. The source of the fifth transistor 322 is coupled to the drain of the sixth transistor 324. The gate of the fifth transistor 322 is configured to receive the value of the input (such as the first input (INP) and the second input (INN)) potential. For example, the gate of the fifth transistor 322 is configured to receive the lowest voltage magnitude between the first input (INP) and the second input (INN). In this example, the lowest input is selected by implementing logic circuitry. In some examples, the lowest input is selected by implementing analog circuitry.

The gate of the sixth transistor 324 is coupled to the output of the window comparator 306. The source of the sixth transistor 324 is coupled to the first current source 330 (which is coupled to ground). The sources of the first transistor 314 and the second transistor 316 are coupled to the source of the fifth transistor 322, to the drain of the sixth transistor 324 and to the drain of seventh transistor 326. The fifth transistor 322 and the sixth transistor 324 are N-channel MOSFETs (nMOSFETs). Alternatively, the fifth transistor 322 and the sixth transistor 324 may be P-channel MOSFETs (pMOSFETs), N-channel field-effect transistors (FETs), N-channel insulated-gate bipolar transistors (IGBTs), N-channel junction field effect transistors (JFETs), or NPN bipolar junction transistor (BJTs).

In FIG. 3, the current steering circuitry 312 includes a seventh transistor 326 and an eighth transistor 328. The seventh transistor 326 includes a drain, a source, and a gate. The eighth transistor 328 includes a drain, a source, and a gate. The gate of the seventh transistor 326 is coupled to the output of the window comparator 306. The gate of the eighth transistor 328 is coupled to the output of the logic gate 308. The sources of the seventh transistor 326 and the eighth transistor 328 are coupled to a supply voltage (Vdd) through a second current source 332. The drain of the seventh transistor 326 is coupled to the sources of the first transistor 314 and the second transistor 316. The drain of the eighth transistor 328 is coupled to the sources of the third transistor 318 and fourth transistor 320. The seventh transistor 326 and the eighth transistor 328 are pMOSFETs. Alternatively, the seventh transistor 326 and the eighth transistor 328 may be P-channel FETs, P-channel IGBTs, P-channel JFETs, or PNP BJTs.

In an example first operation of the second input circuitry 300, the magnitude of the potential applied to INP and INN are equal or approximately equal. The window comparator 306 outputs a low voltage responsive to zero or approximately zero difference between INP and INN. For example, the differential voltage does not meet or exceed the input differential threshold voltage of the window comparator 306 and, thus, the window comparator 306 outputs a low voltage. The seventh transistor 326 conducts current responsive to obtaining the low voltage from the output of the window comparator 306 at the gate. The logic gate 308 outputs a high voltage responsive to obtaining the low voltage from the window comparator 306. The eighth transistor 328 does not conduct current responsive to obtaining the high voltage at the gate and, thus, is turned off.

During the example first operation, the first transistor 314 and the second transistor 316 (e.g., collectively the main input pair 302) are on and conducting current responsive to the current from the seventh transistor 326. The drains of the first transistor 314 and the second transistor 316 are coupled to a first stage of an amplifier (e.g., the first stage circuitry 104 of the amplifier circuitry 100 of FIG. 1). Therefore, the first stage of the amplifier obtains a current from the main input pair 302.

In an example second operation, INP has a greater value than INN and, thus, there is an input differential at the main input pair 302. When the input differential is greater than the input differential threshold voltage, the window comparator 306 causes the source follower circuitry 310 and the current steering circuitry 312 to turn off the main input pair 302 and turn on the auxiliary input pair 304. For example, the window comparator 306 triggers in response to the difference between INP and INN crossing the input differential threshold voltage. The output of the window comparator 306 goes high. The seventh transistor 326 turns off (e.g., stops conducting current) responsive to the high output of the window comparator 306 and, thus, the main input pair 302 stops conducting current. The source follower circuitry 310 ensures that the sources of the first transistor 314 and second transistor 316 do not float to a voltage that is high enough for degradation (e.g., aging) when the seventh transistor 326 stops conducting current. For example, the source follower circuitry 310 forces the potential at the sources of the first transistor 314 and second transistor 316 to ground and/or to a low voltage.

In the example second operation, the logic gate 308 outputs a logic low in response to the high output of the window comparator 306. The eighth transistor 328 turns on and, thus, the auxiliary input pair 304 (e.g., the third transistor 318 and the fourth transistor 320) turns on and begins to conduct current. The drains of the third transistor 318 and the fourth transistor 320 are coupled to the first stage of an amplifier (e.g., the first stage circuitry 104 of the amplifier circuitry 100 of FIG. 1). Therefore, the first stage of the amplifier obtains a current from the auxiliary input pair 304 while the main input pair 302 avoids the negative effects of differential input voltage. The auxiliary input pair 304 thus degrades over time while the main input pair 302 does not degrade.

Figure 4:
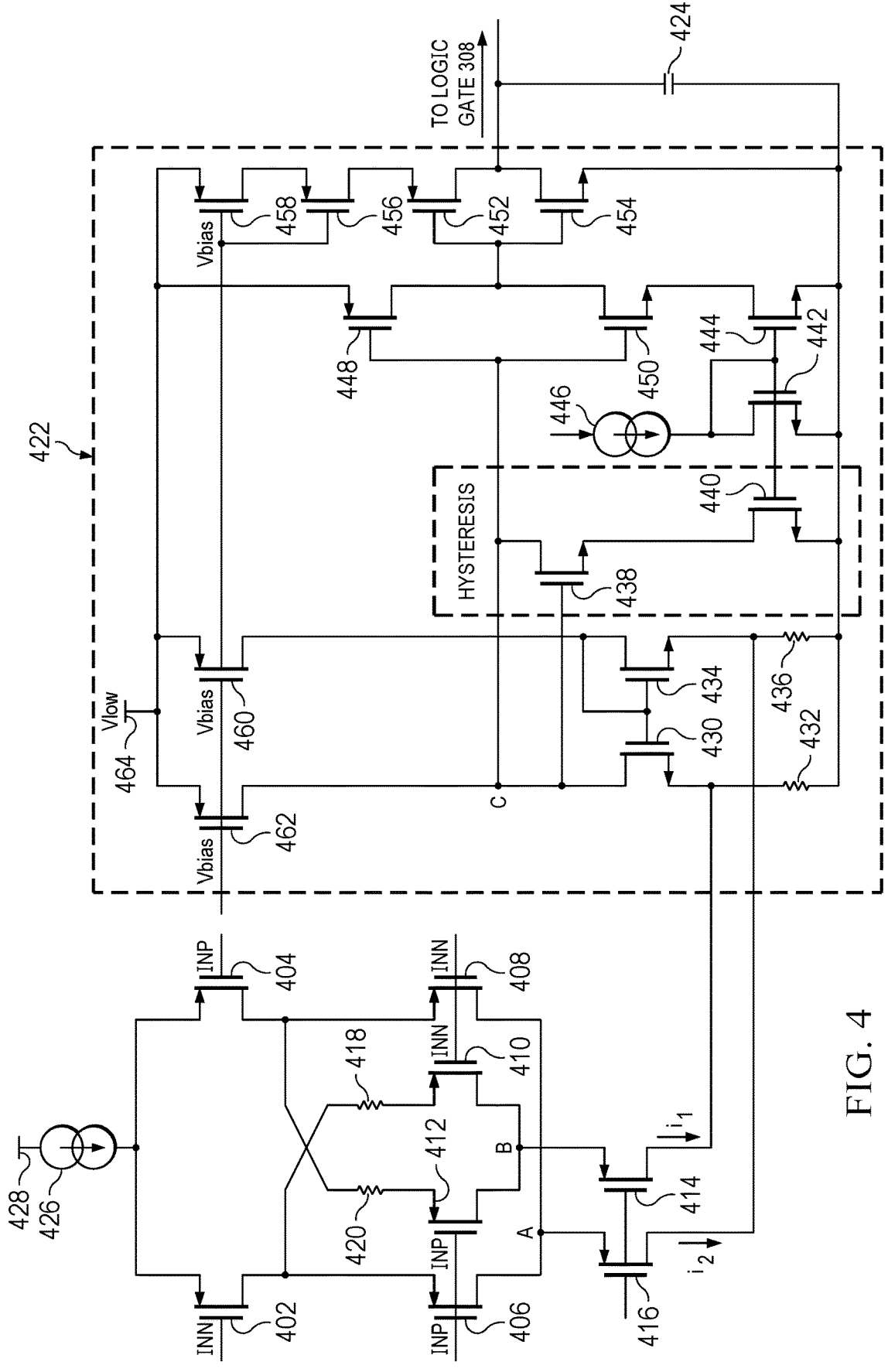
FIG. 4 is a schematic diagram of an example window comparator of FIG. 3 to monitor regulated and unregulated conditions of the amplifier circuitry.

FIG. 4 is a schematic diagram of an example window comparator 400 to compare input signals of amplifier circuitry (e.g., amplifier circuitry 100). In this example, the window comparator 400 may be used to implement the window comparator 306 of FIG. 3. Additionally and/or alternatively, the window comparator 400 may be implemented by any comparator or amplifier circuitry to monitor the input signals. The window comparator 400 includes an example first transistor 402, an example second transistor 404, an example third transistor 406, an example fourth transistor 408, an example fifth transistor 410, an example sixth transistor 412, an example seventh transistor 414, an example eighth transistor 416, an example first resistor 418, an example second resistor 420, an output stage 422, and an example capacitor 424.

The first transistor 402, second transistor 404, third transistor 406, fourth transistor 408, fifth transistor 410, sixth transistor 412, seventh transistor 414, and eighth transistor 416 are pMOSFETs. Alternatively, first transistor 402, second transistor 404, third transistor 406, fourth transistor 408, fifth transistor 410, sixth transistor 412, seventh transistor 414, and eighth transistor 416 may be P-channel FETs, P-channel IGBTs, P-channel JFETs, or PNP BJTs.

In FIG. 4, the first transistor 402 includes a drain, a source, and a gate. The second transistor 404 includes a drain, a source, and a gate. The third transistor 406 includes a drain, a source, and a gate. The fourth transistor 408 includes a drain, a source, and a gate. The fifth transistor 410 includes a drain, a source, and a gate. The sixth transistor 412 includes a drain, a source, and a gate. The seventh transistor 414 includes a drain, a source, and a gate.

The gate of the first transistor 402 is configured to receive and/or obtain a second input signal, INN and the gate of the second transistor 404 is configured to receive and/or obtain a first input signal, INP. The sources of the first transistor 402 and second transistor 404 are coupled to a first terminal of a first current source 426. A second terminal of the first current source 426 is coupled to a supply voltage (AVDD) 428. The drain of the first transistor 402 is coupled to the source of the third transistor 406. The drain of the second transistor 404 is coupled to the source of the fourth transistor 408. The gate of the third transistor 406 is configured to receive and/or obtain the first input signal, INP. The gate of the fourth transistor 408 is configured to receive and/or obtain the second input signal, INN. The drain of the third transistor 406 is coupled to the source of the eighth transistor 416 and is coupled to the drain of the fourth transistor 408 at node A. The drains of the third transistor 406 and the fourth transistor 408 are coupled to the source of the eighth transistor at node A. The drain of the first transistor 402 is coupled to the first resistor 418 and the drain of the second transistor 404 is coupled to the second resistor 420. The first resistor 418 is coupled to the source of the fifth transistor 410 and the second resistor 420 is coupled to the source of the sixth transistor 412. The gate of the fifth transistor 410 is configured to receive and/or obtain the second input signal, INN. The gate of the sixth transistor 412 is configured to receive and/or obtain the first input signal, INP. The drain of the fifth transistor 410 is coupled to the source of the seventh transistor 414, to the drain of the sixth transistor 412 and to the source of the seventh transistor 414, at node B. The drain of the eighth transistor 416 is coupled to a first input of the output stage 422. The drain of the seventh transistor 414 is coupled to a second input of the output stage 422. The output of the output stage 422 is coupled to the capacitor 424 and to an input of a logic gate (e.g., logic gate 308 of FIG. 3).

The output stage 422 includes a ninth transistor 430, a third resistor 432, a tenth transistor 434, a fourth resistor 436, an eleventh transistor 438, a twelfth transistor 440, a thirteenth transistor 442, a fourteenth transistor 444, a second current source 446, a fifteenth transistor 448, a sixteenth transistor 450, a seventeenth transistor 452, an eighteenth transistor 454, a nineteenth transistor 456, a twentieth transistor 458, a twenty-first transistor 460, and a twenty-second transistor 462.

In FIG. 4, the ninth transistor 430, the tenth transistor 434, the eleventh transistor 438, the twelfth transistor 440, the thirteenth transistor 442, the fourteenth transistor 444, the sixteenth transistor 450, and the eighteenth transistor 454 are nMOSFETs. Alternatively, the ninth transistor 430, the tenth transistor 434, the eleventh transistor 438, the twelfth transistor 440, the thirteenth transistor 442, the fourteenth transistor 444, the sixteenth transistor 450, and the eighteenth transistor 454 may be pMOSFETs, N-channel FETs, N-channel IGBTs, N-channel JFETs, or NPN BJTs.

In FIG. 4, the fifteenth transistor 448, the seventeenth transistor 452, the nineteenth transistor 456, the twentieth transistor 458, the twenty-first transistor 460, and the twenty-second transistor 462 are pMOSFETs. Alternatively, the fifteenth transistor 448, the seventeenth transistor 452, the nineteenth transistor 456, the twentieth transistor 458, the twenty-first transistor 460, and the twenty-second transistor 462 may be nMOSFETs, P-channel FETs, P-channel IGBTs, P-channel JFETs, or PNP BJTs.

In FIG. 4, the ninth transistor 430 includes a drain, source, and gate, and the tenth transistor 434 includes a drain, source, and gate. The source of the ninth transistor 430 is coupled to the drain of the seventh transistor 414 and to the third resistor 432. The source of the tenth transistor 434 is coupled to the drain of the eighth transistor 416 and to the fourth resistor 436. The gates of the ninth transistor 430 and tenth transistor 434 are coupled together. The drain of the tenth transistor 434 is coupled to gates of the ninth transistor 430 and tenth transistor 434. In this example, the ninth transistor 430 and the tenth transistor 434 convert a differential signal to a single ended output. For example, the ninth transistor 430 and the tenth transistor 434 make up a current mirror that reflects a first input (i2) at an output (e.g., at the drain of the ninth transistor 430) while combining that first input (i2) with a second input (i1) at the output.

In FIG. 4, the eleventh transistor 438 includes a drain, source, and gate, and the twelfth transistor 440 includes a drain, source, and gate. The gate of the eleventh transistor 438 is coupled to the drain of the ninth transistor 430. The source of the eleventh transistor 438 coupled to the drain of the twelfth transistor 440. The eleventh transistor 438 and the twelfth transistor 440 make up hysteresis in the output stage 422. Hysteresis provides a small positive feedback at the gates of the fifteenth transistor 448 and the sixteenth transistor 450, to ensure that there is a low probability of the window comparator 400 randomly toggling between two states when the difference between the inputs (INN and INP) approach the threshold point. For example, when the two inputs (INN and INP) are close to a transition point (e.g., a point where the window comparator 400 toggles from low to high or high to low), the output of the window comparator 400 may rapidly switch states. In some examples, this is due to small amounts of noise on the input signals, which are amplified by a gain (e.g., an open loop gain) of the window comparator 400, causing the output to briefly bounce back and forth. Therefore, a response of the window comparator 400 is improved by adding hysteresis (e.g., through configuration of the eleventh transistor 438 and the twelfth transistor 440).

In FIG. 4, the thirteenth transistor 442 includes a drain, source, and gate, and the fourteenth transistor 444 includes a drain, source, and gate. The gate of the thirteenth transistor 442 is coupled to the gate of the twelfth transistor 440 and to the gate of the fourteenth transistor 444. The drain of the thirteenth transistor 442 is coupled to the second current source 446 and to the gates of the thirteenth transistor 442 and fourteenth transistor 444. The thirteenth transistor 442 and the fourteenth transistor 444 make up a current mirror. For example, thirteenth transistor 442 and the fourteenth transistor 444 form a current mirror that provides a hysteresis bias current for the eleventh transistor 438 and the twelfth transistor 440.

In FIG. 4, the fifteenth transistor 448 includes a drain, source, and gate, and the sixteenth transistor 450 includes a drain, source, and gate. The gates of the fifteenth transistor 448 and the sixteenth transistor 450 are coupled to the drain of the ninth transistor 430. Additionally, the drain of the eleventh transistor 438 is coupled to the gates of the fifteenth transistor 448 and the sixteenth transistor 450 and, thus, to the drain of the ninth transistor 430. The drains of the fifteenth transistor 448 and the sixteenth transistor 450 are coupled together. The source of the fifteenth transistor 448 is coupled to a voltage $V_{low}$ 464. The source of the sixteenth transistor 450 is coupled to the drain of the fourteenth transistor 444. The fifteenth transistor 448 and the sixteenth transistor 450 make up a first inverter. The first inverter (e.g., configured through the fifteenth transistor 448 and the sixteenth transistor 450) enhances a slew-rate of the window comparator 400. The slew-rate is a maximum rate of change of the comparator output voltage. An enhanced slew-rate is a quick rate of change (e.g., quickly changes states).

In FIG. 4, the seventeenth transistor 452 includes a drain, source, and gate, and the eighteenth transistor 454 includes a drain, source, and gate. The gates of the seventeenth transistor 452 and the eighteenth transistor 454 are coupled to the drains of the fifteenth transistor 448 and the sixteenth transistor 450 (e.g., an output of the first inverter). The drains of the seventeenth transistor 452 and the eighteenth transistor 454 are coupled together and to the capacitor 424. The seventeenth transistor 452 and the eighteenth transistor 454 make up a second inverter. The second inverter ensures that a correct state is output by the comparator. For example, the second inverter (e.g., configured through the seventeenth transistor 452 and the eighteenth transistor 454) obtains a state from the first inverter and inverts that state back to the preceding state.

In FIG. 4, the nineteenth transistor 456 includes a drain, source, and gate, the twentieth transistor 458 includes a drain, source, and gate, the twenty-first transistor 460 includes a drain, source, and gate, and the twenty-second transistor 462 includes a drain, source, and gate. The drain of the nineteenth transistor 456 is coupled to the source of the seventeenth transistor 452. The source of the nineteenth transistor 456 is coupled to the drain of the twentieth transistor 458. The gates of the nineteenth transistor 456, the twentieth transistor 458, the twenty-first transistor 460, and the twenty-second transistor 462 are coupled together and are configured to receive a fixed biased voltage to set the required current through those transistors. The sources of the twentieth transistor 458, the twenty-first transistor 460, and the twenty-second transistor 462 are coupled to the voltage $V_{low}$ 464. The drain of the twenty-first transistor 460 is coupled to the drain of the tenth transistor 434. The drain of the twenty-second transistor 462 is coupled to the drain of the ninth transistor 430. Therefore, the drain of the twenty-second transistor 462 is also coupled to the gate and drain of the eleventh transistor 438 and to the gates of the fifteenth transistor 448 and the sixteenth transistor 450.

In FIG. 4, the seventh transistor 414 and the eighth transistor 416 are protection devices. For example, the gate voltages of the seventh transistor 414 and the eighth transistor 416 are biased such that the transistors 414, 416 protect the third transistor 406, the fourth transistor 408, the fifth transistor 410, and the sixth transistor 412 by limiting their drain voltages. In some examples, the gates of the seventh transistor 414 and the eighth transistor 416 are coupled to bias circuitry (not shown). Alternatively, the gates of the seventh transistor 414 and the eighth transistor 416 are coupled to a supply voltage (not shown) that biases the transistors 414, 416. For example, the gates of the seventh transistor 414 and the eighth transistor 416 may be configured to obtain a voltage that keeps the transistors 414, 416 on (e.g., conducting). Additionally and/or alternatively, the gates of the seventh transistor 414 and the eighth transistor 416 are biased by a voltage that is dependent on the input voltage (e.g., INN and INP). For example, the gates of the seventh transistor 414 and the eighth transistor 416 obtain a voltage, corresponding to and/or dependent on INN and INP, directly or from a level shifter (e.g., such as the source follower circuitry 310 of FIG. 3). In some examples, the window comparator 400 does not require protection and, therefore, the seventh transistor 414 and eighth transistor 416 are not included in the window comparator 400. In such an example, node A is coupled directly to the first input of the output stage 422 and node B is coupled directly to the second input of the output stage 422.

There are two possible paths for the current to flow from the first transistor 402 and two possible paths for current to flow from the second transistor 404 (e.g., four current paths in total) depending on the operating mode of the amplifier circuitry. The first two current paths described herein are when amplifier circuitry is operating in a regulated mode (e.g., in a mode where the voltage potential of INN and INP are equal or approximately equal). The first path current can flow through is from the first transistor 402 through the third transistor 406. Current conducting through the first transistor 402 flows through the third transistor 406 responsive to the voltage magnitude at INN being less than a comparator threshold different than the voltage magnitude at INP (e.g., when the amplifier circuitry is operating in a regulated mode). The first path (e.g., from the source of the first transistor 402 to the drain of the third transistor 406 to node A) is the main current path (referred to as the "main current path"). For example, during a regulated condition, current flows from the first transistor 402 through the first main current path.

The second path (referred to as the "second main current path") for current to flow, during a regulated condition, is from the second transistor 404 through the fourth transistor 408 to node A. The first main current path and the second main current path are shorted at node A and, thus, the current through both the first main current path and the second main current path are summed at node A. During the example first operation of the window comparator 400, i2 is greater than it responsive to the voltage potentials of INP and INN having approximately the same value. The output of the window comparator 400 is pulled to ground responsive to i2 being greater than it.

For example, when $i_2$ is greater than $i_1$, the ninth transistor 430 demands (e.g., attempts to sink) more current than is available (e.g., than is provided by the twenty-second transistor 462). For example, the current through the ninth transistor 430 is equivalent to the current through the twenty-second transistor 462 ($I_{pmos}$) plus the difference between $i_1$ and $i_2$ times a value 'K' (e.g., $I_{pmos}+K*(i_2-i_1)$), where 'K' is a value less than one. As such, a potential at node C (e.g., a node located at the coupling point of the drain of the ninth transistor 430 and the gates of the fifteenth transistor 448 and the sixteenth transistor 450) goes to logic '0'. The first inverter (e.g., the configuration of transistors 448 and 450) obtains the logic '0' and inverts the logic '0' to a logic '1.' Subsequently, the second inverter (e.g., the configuration of transistors 452 and 454) obtains the logic '1' and inverts it back to logic '0' at the output of the window comparator 400.

The capacitor 424 ensures that the window comparator 400 turns on slowly in the presence of a high differential input voltage but turns off quickly when the input voltages come close together.

In an example second operation of the window comparator 400, the amplifier circuitry is operating in an unregulated mode (e.g., the voltage potential of INN is less than the voltage potential of INP by a value greater than the comparator threshold voltage). As described above, there are four possible paths for current to flow. The first two paths are associated with a regulated mode. The second two paths, described below, are associated with an unregulated mode of the amplifier circuitry. The third possible path (referred to as the "first differential current path") for current to flow in the window comparator 400 is from the first transistor 402 through the fifth transistor 410, responsive to the magnitude of the potential at INN being more than a comparator threshold value less than the magnitude of the potential at INP. Current flows through the fifth transistor 410 responsive to the gate-to-source voltage of the fifth transistor 410 meeting/exceeding the threshold voltage of fifth transistor 410, which occurs when the differential voltage exceeds the threshold voltage set by the voltage drop across the first resistor 418. The fifth transistor 410 steers the current to the seventh transistor 414 responsive to the voltage at the gate being less than the voltage at the source. In this example, current $i_1$ is greater than the current $i_2$. The output voltage of the window comparator 400 goes high responsive to current it being greater than current $i_2$.

For example, when $i_2$ is less than $i_1$, the current through ninth transistor 430 is less than the current provided by the twenty-second transistor 462, causing the potential at node C to be logic '1.' The first inverter (e.g., the configuration of transistors 448 and 450) obtains the logic '1' and inverts the logic '1' to a logic '0.' Subsequently, the second inverter (e.g., the configuration of transistors 452 and 454) obtains the logic '0' and inverts it back to logic '1' at the output of the window comparator 400.

In an example third operation of the window comparator 400, the amplifier circuitry is operating in an unregulated mode (e.g., the voltage potential of INP is less than the voltage potential of INN by a value greater than the comparator threshold voltage). The fourth possible path (referred to as the "second differential current path") for current to flow in the window comparator 400 is from the second transistor 404 through the sixth transistor 412. For example, current conducting through the second transistor 404 flows through the sixth transistor 412 responsive to the magnitude of the potential at INP being more than a comparator threshold value less than the magnitude of the potential at INN. Current flows through the sixth transistor 412 responsive to the gate-to-source voltage of the sixth transistor 412 meeting/exceeding the threshold voltage of sixth transistor 412. The gate-to-source voltage meets the threshold gate-to-source voltage responsive the differential voltage (e.g., the voltage difference between the magnitude of the voltage at INP and the magnitude of the voltage at INN) exceeding the threshold voltage set by the voltage drop across the second resistor 420. The sixth transistor 412 steers the current to the seventh transistor 414 responsive to the voltage at the gate being less than the voltage at the source. In this example, current $i_1$ is greater than the current $i_2$. The output voltage of the window comparator 400 goes high responsive to current $i_1$ being greater than current $i_2$.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve performance specifications of amplifiers are disclosed herein. Further examples and combinations thereof include the following:

Example 1 includes an apparatus comprising a first amplifier stage (104) having a first stage input, a first input pair (302) having a first input and a first output coupled to the first stage input, a second input pair (304) having a second input and a second output, current steering circuitry (312) having a third input, a fourth input, a third output, and a fourth output, the third output coupled to the first input and the fourth output coupled to the second input, source follower circuitry (310) having a fifth input and a fifth output, the fifth output coupled to the first input, and a comparator (306) having a sixth output coupled to the fifth input.

Example 2 includes the apparatus of example 1, wherein the first input pair (302) comprises a first transistor (314) having a first source coupled to the third output, and a second transistor (316) having a second source coupled to the third output and to the first source.

Example 3 includes the apparatus of example 1, wherein the second input pair (304) comprises a first transistor (318) having a first source coupled to the fourth output, and a second transistor (320) having a second source coupled to the fourth output and to the first source.

Example 4 includes the apparatus of example 1, wherein the current steering circuitry (312) comprises a first transistor (326) having a first drain and a first gate, the first drain coupled to the first input and the first gate coupled to the sixth output, and a second transistor (328) having a second drain and a second gate, the second drain coupled to the second input.

Example 5 includes the apparatus of example 4, wherein the apparatus further includes a logic gate (308) having a sixth input and a sixth output, the sixth input coupled to the fifth output and the sixth output coupled to the second gate of the second transistor (328).

Example 6 includes the apparatus of example 1, wherein the source follower circuitry (310) comprises a first transistor (322) having a first source and a first gate, the first source coupled to the first input and the first gate configured to receive the smaller of a first signal or a second signal, and a second transistor (324) having a second gate and a first drain, the second gate coupled to the fifth output and the first drain coupled to the first source of the first transistor (322).

Example 7 includes the apparatus of example 1, wherein the first input pair (302) comprises a first transistor (314) having a first source and a first gate, the first source coupled to the third output and the first gate configured to receive a first signal (INP), and a second transistor (316) having a second source and a second gate, the second source coupled to the third output and to the first source, and the second gate configured to receive a second signal (INN) that is equivalent to the first signal (INP), the second input pair (304) comprises a third transistor (318) having a third source and a third gate, the third source coupled to the fourth output and third gate configured to receive the first signal (INP), and a fourth transistor (320) having a fourth source and a fourth gate, the fourth source coupled to the fourth output and the third source, the fourth gate configured to receive the second signal (INN), and the current steering circuitry (312) comprises a fifth transistor (326) having a fifth drain and a fifth gate, the fifth drain coupled to the first source and the second source, the fifth gate coupled to the sixth output, and a sixth transistor (328) having a sixth drain and a sixth gate, the sixth drain coupled to the third source and to the fourth source.

Example 8 includes the apparatus of example 7, further including a seventh transistor (322) having a seventh source and a seventh gate, the seventh source coupled to the first source and to the second source, the first gate configured to receive the smaller of the first signal (INP) or the second signal (INN), and an eighth transistor (324) having an eighth gate and an eighth drain, the eighth gate coupled to the fifth output and the eighth drain coupled to the seventh source.

Example 9 includes an amplifier (100) comprising input circuitry including a main input pair (302) having a first input, a first output, and a second output, an auxiliary input pair (304) having a second input, a third output, and a fourth output, the third output coupled to the first output and the fourth output coupled to the second output, and a comparator (306) having a fifth output coupled to the first input and to the second input via a current steering circuit (312), the comparator (306) to control operation of the main input pair (302) and the auxiliary input pair (304), first stage circuitry (104) having first stage input and a first stage output, the first stage input coupled to the first output, the second output, the third output, and the fourth output, second stage circuitry (106) having a second stage input and a second stage output, the second stage input coupled to the first stage output.

Example 10 includes the amplifier of example 9, wherein the current steering circuit (312) includes a third input, a fourth input, a sixth output, and a seventh output, the third input coupled to the fifth output of the comparator (306), the fourth input adapted to be coupled to the fifth output of the comparator (306), the sixth output coupled to the first input, and the seventh output coupled to the second input.

Example 11 includes the amplifier of example 9, wherein the input circuitry further comprises source follower circuitry (310) having a third input and a sixth output, the third input coupled to the fifth output of the comparator (306) and the sixth output coupled to the first input of the main input pair (302).

Example 12 includes the amplifier of example 11, wherein the comparator (306) further comprises a third input configured to receive a first signal (INP), and a fourth input configured to receive a second signal (INN) that is equivalent to the first signal (INP).

Example 13 includes the amplifier of example 12, wherein the fifth output of the comparator (306) is to change in response to the second signal (INN) not being equivalent to the first signal (INP).

Example 14 includes the amplifier of example 9, wherein the current steering circuit (312) includes a third input, a fourth input, a sixth output, and a seventh output, the third input coupled to the fifth output of the comparator (306), the fourth input coupled to the fifth output of the comparator (306) via a logic gate (308), the main input pair (302) comprises a first transistor (314) having a first source and a first gate, the first source coupled to the sixth output and the first gate configured to receive a first signal (INP), and a second transistor (316) having a second source and a second gate coupled to the sixth output and to the first source and the second gate configured to receive a second signal (INN) that is equivalent to the first signal (INP), and the auxiliary input pair (304) comprises a third transistor (318) having a third source and a third gate, the third source coupled to the seventh output and third gate configured to receive the first signal (INP), and a fourth transistor (320) having a fourth source and a fourth gate, the fourth source coupled to the seventh output and the third source, the fourth gate configured to receive the second signal (INN).

Example 15 includes the amplifier of example 14, wherein the input circuitry further comprises the logic gate (308) coupled between the fifth output of the comparator (306) and the fourth input.

Example 16 includes a system comprising a terminal, and an amplifier (100) coupled to the terminal, the amplifier (100) including a first amplifier stage (104) having a first stage input, a first input pair (302) having a first input and a first output coupled to the first stage input, a second input pair (304) having a second input and a second output, current steering circuitry (312) having a third input, a fourth input, a third output, and a fourth output, the third output coupled to the first input and the fourth output coupled to the second input, source follower circuitry (310) having a fifth input and a fifth output, the fifth output coupled to the first input, and a comparator (306) having a sixth output coupled to the fifth input.

Example 17 includes the system of example 16, wherein the first input pair (302) comprises a first transistor (314) having a first source and a first gate, the first source coupled to the third output and the first gate configured to receive a first signal (INP), and a second transistor (316) having a second source and a second gate, the second source coupled to the third output and to the first source, and the second gate configured to receive a second signal (INN) that is equivalent to the first signal, and the second input pair (304) comprises a third transistor (318) having a third source and a third gate, the third source coupled to the fourth output and third gate configured to receive the first signal (INP), and a fourth transistor (320) having a fourth source and a fourth gate, the fourth source coupled to the fourth output and the third source, the fourth gate configured to receive the second signal (INN).

Example 18 includes the system of example 16, wherein the source follower circuitry (310) comprises a first transistor (322) having a first source and a first gate, the first source coupled to the first input and the first gate configured to receive the smaller of a first signal (INP) or a second signal (INN), and a second transistor (324) having a second gate and a first drain, the second gate coupled to the fifth output and the first drain coupled to the first source of the first transistor (322).

Example 19 includes the system of example 16, wherein the current steering circuitry (312) comprises a first transistor (326) having a first drain and a first gate, the first drain coupled to the first input, the fifth gate coupled to the sixth output, and a second transistor (328) having a second drain and a second gate, the second drain coupled to the second input.

Example 20 includes the system of example 16, wherein the amplifier includes a logic gate (308) coupled to the sixth output of the comparator (306).

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

As used herein, the term "bulk terminal" means any type of connection to the substrate and/or underlying doped region (such as a body terminal, a back gate connection, and/or a substrate connection or buried doped region connection through a deep, doped region or through the back surface of the semiconductor die).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

What is claimed is:

1. An apparatus comprising:
a first amplifier stage having a first input;
a first input pair having a first input, and a first output, the first output of the first input pair coupled to the first input of the first amplifier stage;
a second input pair having a first input, and a first output;

current steering circuitry having first and second inputs, and first and second outputs, the first output of the current steering circuitry coupled to the first input of the first input pair, and the second output of the current steering circuitry coupled to the first input of the second input pair;

source follower circuitry having an input and an output, the output of the source follower circuitry coupled to the first input of the first input pair, wherein the source follower circuitry comprises:

a first transistor having a source coupled to the first input of the first input pair, and a gate configured to receive the smaller of a first signal or a second signal; and a second transistor having a gate and a drain, the drain of the second transistor coupled to the output of the source follower circuitry; and a comparator having an output coupled to the gate of the second transistor.

2. The apparatus of claim 1, wherein the first input pair comprises:

a third transistor having a source coupled to the first output of the current steering circuitry; and a fourth transistor having a source coupled to the first output of the current steering circuitry, and to the source of the third transistor.

3. The apparatus of claim 2, wherein the second input pair comprises:

a fifth transistor having a source coupled to the second output of the current steering circuitry; and a sixth transistor having a source coupled to the second output of the current steering circuitry, and to the source of the fifth transistor.

4. The apparatus of claim 1, wherein the current steering circuitry comprises:

a third transistor having a drain and a gate, the drain of the third transistor coupled to the first input of the first input pair, and the gate of the third transistor coupled to the output of the comparator; and a fourth transistor having a drain and a gate, the drain of the fourth transistor coupled to the first input of the second input pair.

5. The apparatus of claim 4, wherein the apparatus further includes a logic gate having an input and an output, the input of the logic gate coupled to the input of the source follower circuitry, and the output of the logic gate coupled to the gate of the fourth transistor.

6. The apparatus of claim 1, wherein:

the first input pair comprises:

a third transistor having a gate configured to receive the first signal; and a fourth transistor having a gate configured to receive the second signal;

the second input pair comprises:

a fifth transistor having gate configured to receive the first signal; and a sixth transistor having a gate configured to receive the second signal.

7. An amplifier comprising:

input circuitry including:

a main input pair having a first input, a first output, and a second output;

an auxiliary input pair having a first input, a first output, and a second output, the first output of the auxiliary input pair coupled to the first output of the main input pair, and the second output of the auxiliary input pair coupled to the second output of the main input pair;

current steering circuit;

source follower circuitry comprising:

a first transistor having a source coupled to the first input of the main input pair, and a gate configured to receive the smaller of a first signal or a second signal; and a second transistor having a gate and a drain, the drain of the second transistor coupled to the source of the first transistor; and a comparator having an output coupled to the gate of the second transistor, the output of the comparator further coupled to the first input of the main input pair and to the first input of the auxiliary input pair via the current steering circuit, the comparator configured to control operation of the main input pair and the auxiliary input pair;

first stage circuitry having an input and an output, the input of the first stage circuitry coupled to the first and second outputs of the main input pair, and to the first and second outputs of the auxiliary input pair; and second stage circuitry having an input coupled to the output of the first stage circuitry.

8. The amplifier of claim 7, wherein the current steering circuit includes first and second inputs, and first and second outputs, the first and second inputs of the current steering circuit coupled to the output of the comparator, the first output of the current steering circuit coupled to the first input of the main input pair, and the second output of the current steering circuit coupled to the first input of the auxiliary input pair.

9. The amplifier of claim 7, wherein the comparator further comprises:

a first input configured to receive the first signal; and a second input configured to receive the second signal.

10. The amplifier of claim 9, wherein the output of the comparator is configured to change in response to the second signal not being equivalent to the first signal.

11. The amplifier of claim 7, wherein:

the current steering circuit includes first and second inputs, and first and second outputs, the first input of the current steering circuit coupled to the output of the comparator, the second input of the current steering circuit coupled to the output of the comparator via a logic gate.

12. The amplifier of claim 11, wherein the logic gate comprises an inverter coupled between the output of the comparator and the second input of the current steering circuit.

13. A system comprising:

a first amplifier stage having an input;

a first input pair having a first input, and a first output, the first output coupled to the input of the first amplifier stage;

a second input pair having a first input, and a first output;

current steering circuitry having first and second inputs, and first and second outputs, the first output of the current steering circuitry coupled to the first input of the first input pair, and the second output of the current steering circuitry coupled to the first input of the second input pair;

source follower circuitry having an input and an output, the output of the source follower circuitry coupled to the first input of the first input pair; and a comparator having an output coupled to the input of the source follower circuitry, wherein the source follower circuitry comprises:

a first transistor having a source and a gate, the source of the first transistor coupled to the first input of the first input pair, and the gate of the first transistor configured to receive the smaller of a first signal or a second signal; and a second transistor having a gate and a drain, the gate of the second transistor coupled to the output of the comparator, and the drain of the second transistor coupled to the source of the first transistor.

14. The system of claim 13, wherein:

the first input pair comprises:

a third transistor having a source and a gate, the source of the third transistor coupled to the first output of the current steering circuitry, and the gate of the third transistor configured to receive the first signal; and a second transistor having a source and a gate, the source of the second transistor coupled to the first output of the current steering circuitry, and to the source of the first transistor, and the gate of the second transistor configured to receive the second signal; and the second input pair comprises:

a fifth transistor having a source and a gate, the source of the fifth transistor coupled to the second output of the current steering circuitry, and gate of the fifth transistor configured to receive the first signal; and a sixth transistor having a source and a gate, the source of the sixth transistor coupled to the second output of the current steering circuitry and the source of the sixth transistor, the gate of the sixth transistor configured to receive the second signal.

15. The system of claim 13, wherein the current steering circuitry comprises:

a third transistor having a drain and a gate, the drain of the third transistor coupled to the first input of the first input pair, the gate of the third transistor coupled to the output of the comparator; and a fourth transistor having a drain coupled to the first input of the second input pair.

16. The system of claim 13, further comprising a logic gate coupled to the output of the comparator.

17. The system of claim 13, wherein the comparator is a window comparator.

18. The amplifier of claim 7, wherein the main input pair comprises:

a third transistor having a gate configured to receive the first signal; and a fourth transistor having a gate configured to receive the second signal; and the auxiliary input pair comprises:

a fifth transistor having a gate configured to receive the first signal; and a sixth transistor having a gate configured to receive the second signal.

19. The amplifier of claim 7, wherein the comparator is a window comparator.

20. The apparatus of claim 1, wherein the comparator is a window comparator.

\* \* \* \* \*